US008936959B1

(12) United States Patent
Yang

(10) Patent No.: US 8,936,959 B1
(45) Date of Patent: Jan. 20, 2015

(54) INTEGRATED RF MEMS, CONTROL SYSTEMS AND METHODS

(75) Inventor: Xiao (Charles) Yang, Cupertino, CA (US)

(73) Assignee: mCube Inc., San Jose, CA (US)

(*) Notice: Subject to any disclaimer, the term of this patent is extended or adjusted under 35 U.S.C. 154(b) by 704 days.

(21) Appl. No.: 13/035,969

(22) Filed: Feb. 26, 2011

Related U.S. Application Data

(60) Provisional application No. 61/308,945, filed on Feb. 27, 2010, provisional application No. 61/356,467, filed on Jun. 18, 2010.

(51) Int. Cl.
*B81C 1/00* (2006.01)

(52) U.S. Cl.
USPC ............... 438/48; 438/50; 438/52; 438/53; 438/6

(58) Field of Classification Search
USPC ............. 438/57, 73, 74, 80, 6, 48, 50, 52, 53; 381/150
See application file for complete search history.

(56) References Cited

U.S. PATENT DOCUMENTS

| 3,614,677 A | 10/1971 | Wilfinger |
| 4,954,698 A | 9/1990 | Yasunaga et al. |
| 5,140,745 A | 8/1992 | McKenzie |
| 5,157,841 A | 10/1992 | Dinsmore |
| 5,173,597 A | 12/1992 | Anglin |
| 5,488,765 A | 2/1996 | Kubota et al. |
| 5,493,769 A | 2/1996 | Sakai et al. |
| 5,610,414 A | 3/1997 | Yoneda et al. |
| 5,668,033 A | 9/1997 | Ohara |
| 5,729,074 A | 3/1998 | Shiomi et al. |
| 6,046,409 A | 4/2000 | Ishii et al. |
| 6,076,731 A | 6/2000 | Terrell |
| 6,115,261 A | 9/2000 | Platt et al. |
| 6,188,322 B1 | 2/2001 | Yao |
| 6,263,736 B1 | 7/2001 | Thunder et al. |
| 6,278,178 B1 | 8/2001 | Kwon et al. |
| 6,480,699 B1 | 11/2002 | Lovoi |
| 6,483,172 B1 | 11/2002 | Cote |
| 6,485,273 B1 | 11/2002 | Goodwin-Johansson |
| 6,534,726 B1 | 3/2003 | Okada et al. |
| 6,576,999 B2 | 6/2003 | Sakai et al. |
| 6,656,604 B2 | 12/2003 | Hasewaga |
| 6,753,664 B2 | 6/2004 | Neufeld et al. |
| 6,855,572 B2 | 2/2005 | Jeung et al. |
| 6,912,336 B2 | 6/2005 | Ishii |
| 6,933,165 B2 | 8/2005 | Musolf et al. |
| 6,979,872 B2 | 12/2005 | Borwick |

(Continued)

OTHER PUBLICATIONS

U.S. Appl. No. 12/913,440, Final Office Action mailed Oct. 10, 2013, 10 pages.

(Continued)

*Primary Examiner* — Daniel Whalen
*Assistant Examiner* — Suberr Chi
(74) *Attorney, Agent, or Firm* — Kilpatrick Townsend and Stockton LLP

(57) ABSTRACT

An rf MEMS system has a semiconductor substrate, e.g., silicon. The system also has a control module provided overlying one or more first regions of the semiconductor substrate according to a specific embodiment. The system also has a base band module provided overlying one or more second regions of the semiconductor substrate and an rf module provided overlying one or more third regions of the semiconductor substrate. The system also has one or more MEMS devices integrally coupled to at least the rf module.

13 Claims, 13 Drawing Sheets

(56) References Cited

U.S. PATENT DOCUMENTS

| | | | |
|---|---|---|---|
| 7,019,434 B2 | 3/2006 | Helmbrecht | |
| 7,095,226 B2 | 8/2006 | Wan et al. | |
| 7,145,555 B2 | 12/2006 | Taylor et al. | |
| 7,183,630 B1 | 2/2007 | Fogelson et al. | |
| 7,193,312 B2 | 3/2007 | Boon et al. | |
| 7,195,945 B1 | 3/2007 | Edelstein et al. | |
| 7,239,000 B2 | 7/2007 | Witcraft | |
| 7,253,079 B2 | 8/2007 | Hanson et al. | |
| 7,258,009 B2 | 8/2007 | Imai | |
| 7,358,724 B2 | 4/2008 | Taylor et al. | |
| 7,370,530 B2 | 5/2008 | DCamp et al. | |
| 7,391,091 B2 | 6/2008 | Tondra | |
| 7,402,449 B2 | 7/2008 | Fukuda et al. | |
| 7,430,674 B2 | 9/2008 | Van Mueller et al. | |
| 7,453,269 B2 | 11/2008 | Won et al. | |
| 7,454,705 B2 | 11/2008 | Cadez et al. | |
| 7,456,042 B2 | 11/2008 | Stark | |
| 7,493,496 B2 | 2/2009 | Smith et al. | |
| 7,498,715 B2 | 3/2009 | Yang | |
| 7,511,379 B1 | 3/2009 | Flint | |
| 7,514,760 B1 * | 4/2009 | Quevy | 257/416 |
| 7,521,783 B2 | 4/2009 | Tsai et al. | |
| 7,536,909 B2 | 5/2009 | Zhao et al. | |
| 7,585,750 B2 | 9/2009 | Do et al. | |
| 7,599,277 B1 | 10/2009 | Kato et al. | |
| 7,612,443 B1 * | 11/2009 | Bernstein et al. | 257/685 |
| 7,671,478 B2 | 3/2010 | Wathanawasam et al. | |
| 7,676,340 B2 | 3/2010 | Yasui | |
| 7,690,255 B2 | 4/2010 | Gogoi et al. | |
| 7,708,189 B1 | 5/2010 | Cipriano | |
| 7,713,785 B1 | 5/2010 | Flint | |
| 7,779,689 B2 | 8/2010 | Li et al. | |
| 7,814,791 B2 | 10/2010 | Andersson et al. | |
| 7,814,792 B2 | 10/2010 | Tateyama et al. | |
| 7,814,793 B2 | 10/2010 | Sato | |
| 7,861,422 B2 | 1/2011 | MacDonald | |
| 7,891,103 B2 | 2/2011 | Mayor | |
| 8,011,577 B2 | 9/2011 | Mullen et al. | |
| 8,016,191 B2 | 9/2011 | Bonalle et al. | |
| 8,037,758 B2 | 10/2011 | Sato | |
| 8,056,412 B2 | 11/2011 | Rutkiewicz et al. | |
| 8,061,049 B2 | 11/2011 | Mayor | |
| 8,070,055 B2 | 12/2011 | Block et al. | |
| 8,087,296 B2 | 1/2012 | Ueda et al. | |
| 8,140,358 B1 | 3/2012 | Ling et al. | |
| 8,148,808 B2 | 4/2012 | Braden et al. | |
| 8,165,323 B2 | 4/2012 | Zhou | |
| 8,181,874 B1 | 5/2012 | Wan et al. | |
| 8,227,285 B1 | 7/2012 | Yang | |
| 8,236,577 B1 | 8/2012 | Hsu | |
| 8,245,923 B1 | 8/2012 | Merrill et al. | |
| 8,250,921 B2 | 8/2012 | Nasiri et al. | |
| 8,259,311 B2 | 9/2012 | Petschko | |
| 8,324,047 B1 | 12/2012 | Yang | |
| 8,342,021 B2 | 1/2013 | Oshio | |
| 8,367,522 B1 | 2/2013 | Yang | |
| 8,395,252 B1 | 3/2013 | Yang | |
| 8,395,381 B2 | 3/2013 | Lo | |
| 8,402,666 B1 | 3/2013 | Hsu et al. | |
| 8,407,905 B1 | 4/2013 | Hsu et al. | |
| 8,421,082 B1 | 4/2013 | Yang | |
| 8,476,084 B1 | 7/2013 | Yang et al. | |
| 8,476,129 B1 | 7/2013 | Jensen et al. | |
| 8,477,473 B1 | 7/2013 | Koury et al. | |
| 8,486,723 B1 | 7/2013 | Wan et al. | |
| 2001/0053565 A1 | 12/2001 | Khoury | |
| 2002/0072163 A1 | 6/2002 | Wong et al. | |
| 2002/0134837 A1 | 9/2002 | Kishon | |
| 2003/0058069 A1 | 3/2003 | Schwartz et al. | |
| 2003/0095115 A1 | 5/2003 | Brian et al. | |
| 2003/0133489 A1 | 7/2003 | Hirota et al. | |
| 2003/0184189 A1 | 10/2003 | Sinclair | |
| 2003/0230802 A1 | 12/2003 | Poo et al. | |
| 2004/0002808 A1 | 1/2004 | Hashimoto et al. | |
| 2004/0016995 A1 | 1/2004 | Kuo et al. | |
| 2004/0017644 A1 | 1/2004 | Goodwin-Johansson | |
| 2004/0056742 A1 | 3/2004 | Dabbaj | |
| 2004/0063325 A1 | 4/2004 | Urano et al. | |
| 2004/0104268 A1 | 6/2004 | Bailey | |
| 2004/0113246 A1 | 6/2004 | Boon | |
| 2004/0119836 A1 | 6/2004 | Kitaguchi et al. | |
| 2004/0140962 A1 | 7/2004 | Wang et al. | |
| 2004/0177045 A1 | 9/2004 | Brown | |
| 2004/0207035 A1 | 10/2004 | Witcraft et al. | |
| 2004/0227201 A1 | 11/2004 | Borwick et al. | |
| 2005/0074147 A1 | 4/2005 | Smith et al. | |
| 2005/0090038 A1 | 4/2005 | Wallace | |
| 2005/0174338 A1 | 8/2005 | Ing | |
| 2005/0199791 A1 | 9/2005 | Sengoku et al. | |
| 2005/0247787 A1 | 11/2005 | Von Mueller et al. | |
| 2006/0049826 A1 | 3/2006 | Daneman et al. | |
| 2006/0081954 A1 | 4/2006 | Tondra et al. | |
| 2006/0141786 A1 | 6/2006 | Boezen et al. | |
| 2006/0168832 A1 | 8/2006 | Yasui et al. | |
| 2006/0192465 A1 | 8/2006 | Kornbluh et al. | |
| 2006/0208326 A1 | 9/2006 | Nasiri et al. | |
| 2006/0211044 A1 | 9/2006 | Green | |
| 2006/0238621 A1 | 10/2006 | Okubo et al. | |
| 2006/0243049 A1 | 11/2006 | Ohta et al. | |
| 2006/0274399 A1 | 12/2006 | Yang | |
| 2007/0046239 A1 | 3/2007 | Hashizume | |
| 2007/0132733 A1 | 6/2007 | Ram | |
| 2007/0152976 A1 | 7/2007 | Townsend et al. | |
| 2007/0181962 A1 | 8/2007 | Partridge et al. | |
| 2007/0200564 A1 | 8/2007 | Motz et al. | |
| 2007/0281379 A1 | 12/2007 | Stark et al. | |
| 2008/0014682 A1 | 1/2008 | Yang et al. | |
| 2008/0066547 A1 | 3/2008 | Tanaka et al. | |
| 2008/0110259 A1 | 5/2008 | Takeno | |
| 2008/0119000 A1 | 5/2008 | Yeh et al. | |
| 2008/0123242 A1 | 5/2008 | Zhou | |
| 2008/0210007 A1 | 9/2008 | Yamaji et al. | |
| 2008/0211043 A1 | 9/2008 | Chen | |
| 2008/0211113 A1 | 9/2008 | Chua et al. | |
| 2008/0211450 A1 | 9/2008 | Yamada et al. | |
| 2008/0277747 A1 | 11/2008 | Ahmad | |
| 2008/0283991 A1 | 11/2008 | Reinert | |
| 2009/0007661 A1 | 1/2009 | Nasiri et al. | |
| 2009/0015251 A1 | 1/2009 | Azumi et al. | |
| 2009/0049911 A1 | 2/2009 | Fukuda et al. | |
| 2009/0108440 A1 | 4/2009 | Meyer et al. | |
| 2009/0115412 A1 | 5/2009 | Fuse | |
| 2009/0153500 A1 | 6/2009 | Cho et al. | |
| 2009/0262074 A1 | 10/2009 | Nasiri et al. | |
| 2009/0267906 A1 | 10/2009 | Schroderus | |
| 2009/0307557 A1 | 12/2009 | Rao et al. | |
| 2009/0321510 A1 | 12/2009 | Day et al. | |
| 2010/0044121 A1 | 2/2010 | Simon et al. | |
| 2010/0045282 A1 | 2/2010 | Shibasaki et al. | |
| 2010/0071467 A1 | 3/2010 | Nasiri et al. | |
| 2010/0075481 A1 | 3/2010 | Yang | |
| 2010/0083756 A1 | 4/2010 | Merz et al. | |
| 2010/0095769 A1 | 4/2010 | Matsumoto et al. | |
| 2010/0109102 A1 | 5/2010 | Chen et al. | |
| 2010/0171570 A1 * | 7/2010 | Chandrahalim et al. | 333/186 |
| 2010/0208118 A1 | 8/2010 | Ueyama | |
| 2010/0236327 A1 | 9/2010 | Mao | |
| 2010/0248662 A1 | 9/2010 | Sheynblat et al. | |
| 2010/0260388 A1 | 10/2010 | Garret et al. | |
| 2010/0302199 A1 | 12/2010 | Taylor et al. | |
| 2010/0306117 A1 | 12/2010 | Terayoko | |
| 2010/0307016 A1 | 12/2010 | Mayor et al. | |
| 2010/0312519 A1 | 12/2010 | Huang et al. | |
| 2011/0131825 A1 | 6/2011 | Mayor et al. | |
| 2011/0146401 A1 | 6/2011 | Inaguma et al. | |
| 2011/0154905 A1 | 6/2011 | Hsu | |
| 2011/0172918 A1 | 7/2011 | Tome | |
| 2011/0183456 A1 | 7/2011 | Hsieh et al. | |
| 2011/0198395 A1 | 8/2011 | Chen | |
| 2011/0265574 A1 | 11/2011 | Yang | |
| 2011/0266340 A9 | 11/2011 | Block et al. | |
| 2011/0312349 A1 | 12/2011 | Forutanpour et al. | |

(56) References Cited

U.S. PATENT DOCUMENTS

2012/0007597 A1 1/2012 Seeger et al.
2012/0007598 A1 1/2012 Lo et al.
2012/0215475 A1 8/2012 Rutledge et al.

OTHER PUBLICATIONS

U.S. Appl. No. 12/944,712 Final Office Action mailed Aug. 21, 2013, 15 pages.
U.S. Appl. No. 12/983,309 Notice of Allowance mailed Aug. 13, 2013, 11 pages.
U.S. Appl. No. 13/924,457 Notice of Allowance mailed Sep. 18, 2013, 11 pages.
U.S. Appl. No. 13/035,968 Non-Final Office Action mailed Jul. 31, 2013, 8 pages.
U.S. Appl. No. 13/751,014 Notice of Allowance mailed Jul. 31, 2013, 9 pages.
U.S. Appl. No. 12/787,368 Non-Final Office Action mailed Sep. 19, 2013, 19 pages.
U.S. Appl. No. 13/922,983 Notice of Allowance mailed Oct. 7, 2013, 10 pages.
U.S. Appl. No. 12/787,200 Notice of Allowance mailed Sep. 26, 2013, 11 pages.
U.S. Appl. No. 13/177,053 Non-Final Office Action mailed Sep. 18, 2013, 12 pages.
U.S. Appl. No. 13/164,311 Notice of Allowance mailed Sep. 17, 2013, 8 pages.
U.S. Appl. No. 13/163,672 Non-Final Office Action mailed Sep. 5, 2013, 7 pages.
U.S. Appl. No. 12/940,025 Notice of Allowance mailed Oct. 17, 2013, 10 pages.
U.S. Appl. No. 13/069,355 Final Office Action mailed Oct. 31, 2013, 15 pages.

* cited by examiner

INTEGRATED RF MEMS, CONTROL SYSTEMS AND METHODS

CROSS-REFERENCES TO RELATED APPLICATIONS

The present application claims priority to and incorporates by reference, for all purposes, the following patent application: U.S. Pat. App. No. 61/308,945, filed Feb. 27, 2010. The present invention also incorporates by reference, for all purposes, the following patent applications related to sensor and MEMS devices: U.S. patent application Ser. No. 12/859,631, filed Aug. 19, 2010, U.S. Pat. App. No. 61/356,467, filed Jun. 18, 2010, U.S. patent application Ser. No. 12/859,672, filed Aug. 19, 2010, and U.S. patent application Ser. No. 12/859,647, filed Aug. 19, 2010.

BACKGROUND OF THE INVENTION

The present invention relates generally to integrated devices. More particularly, embodiments of the present invention provide a system and method for integrating MEMS devices with other system applications configured on at least CMOS integrated circuit devices. More specifically, the present invention provides one or more MEMS devices and related elements for radio frequency (rf) applications. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices and systems are provided. More particularly, embodiments of the present invention provide a system and method for integrating MEMS devices with other system applications configured on at least CMOS integrated circuit devices. More specifically, the present invention provides one or more MEMS devices and related elements for radio frequency applications. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

In a specific embodiment, the present invention provides a method for manufacturing an rf MEMS system. The system has a semiconductor substrate, e.g., silicon. The system also has a control module provided overlying one or more first regions of the semiconductor substrate according to a specific embodiment. The system also has a base band module provided overlying one or more second regions of the semiconductor substrate and an rf module provided overlying one or more third regions of the semiconductor substrate. The system also has one or more MEMS devices integrally coupled to at least the rf module.

Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved MEMS device system and related applications for a variety of uses. In one or more embodiments, the present invention provides for rf MEMS and related applications, which may be integrated on one or more CMOS device structures. Depending upon the embodiment, one or more of these benefits may be achieved. These and other benefits will be described in more throughout the present specification and more particularly below.

Various additional embodiments, features, and advantages of the present invention can be more fully appreciated with reference to the detailed description and accompanying drawings that follow.

DETAILED DESCRIPTION OF THE INVENTION

According to the present invention, techniques related generally to integrated devices and systems are provided. More particularly, embodiments of the present invention provide a system and method for integrating MEMS devices with other system applications configured on at least CMOS integrated circuit devices. More specifically, the present invention provides one or more MEMS devices and related elements for radio frequency applications. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
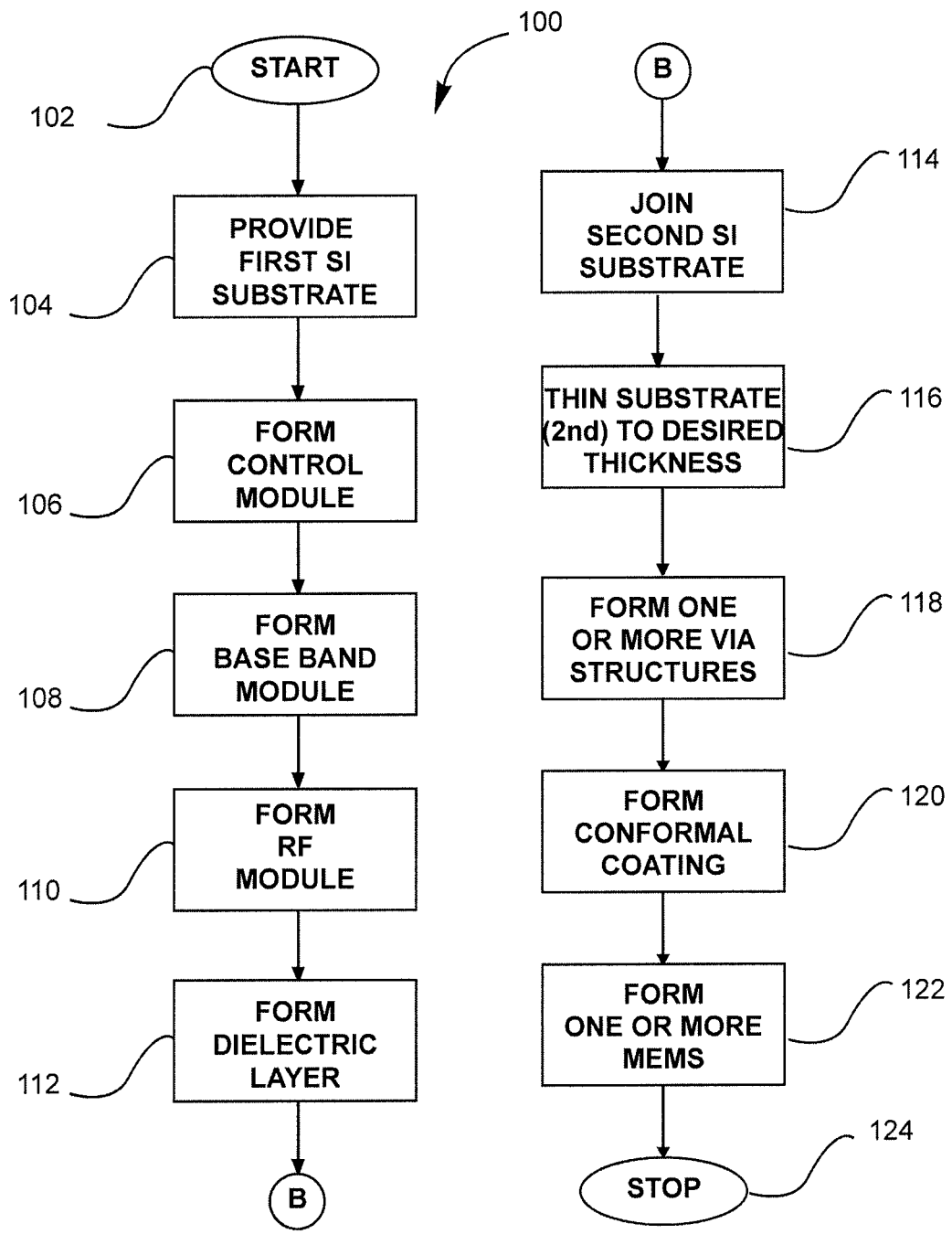
FIG. 1 is a simplified flow diagram illustrating a method of fabricating an integrated RF MEMS and control systems device according to an embodiment of the present invention.

FIG. 1 is a simplified flow diagram illustrating a method of fabricating an integrated RF MEMS and control systems device according to an embodiment of the present invention. This diagram is merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

As shown in FIG. 1, the present method can be briefly outlined below.

1. Start;
2. Provide a first semiconductor substrate;
3. Form a control module provided on a first CMOS IC device region;
4. Form a base band module provided on a second CMOS IC device region;
5. Form an rf module provided on a third CMOS IC device region;
6. Form a dielectric layer overlying the first, second, and third CMOS surface regions;
7. Join a second semiconductor substrate to the dielectric layer;
8. Thin the second semiconductor substrate to a desired thickness;
9. Form one or more via structures;
10. Form a conformal coating of metal material;
11. Form one or more free-standing MEMS structures; and
12. Stop.

These steps are merely examples and should not unduly limit the scope of the claims herein. As shown, the above method provides a way of fabricating an integrated electronic compass and circuit device according to an embodiment of the present invention. One of ordinary skill in the art would recognize many other variations, modifications, and alternatives. For example, various steps outlined above may be added, removed, modified, rearranged, repeated, and/or overlapped, as contemplated within the scope of the invention.

As shown in FIG. 1, method 100 begins at start, step 102. The present method provides a fabrication method for forming an integrated RF MEMS and control systems device. Many benefits are achieved by way of the present invention over conventional techniques. For example, the present technique provides an easy to use process that relies upon conventional technology. In some embodiments, the method provides higher device yields in dies per wafer with the integrated approach. Additionally, the method provides a process and system that are compatible with conventional process technology without substantial modifications to conventional equipment and processes. Preferably, the invention provides for an improved integrated RF MEMS and CMOS circuit device and related methods for a variety of uses. Depending upon the embodiment, one or more of these benefits may be achieved. These and other benefits will be described in more throughout the present specification and more particularly below.

Following step 102, fabrication method 100 involves providing a first semiconductor substrate having a first surface region, step 104. A control module is then formed on one or more first regions of the first surface region, step 106. In an embodiment, the control module can be provided on a first CMOS integrated circuit (IC) device region overlying the one or more first regions of the first surface region. The first CMOS IC circuit device region can have a first CMOS surface region. A base band module is formed on one or more second regions of the first surface region, step 108, following the formation of the control module. In an embodiment, the base band module can be provided on a second CMOS IC device region overlying one or more second regions of the first surface region. The second CMOS IC device region can have a second CMOS surface region. Additionally, an rf module is formed on one or more third regions of the first surface region, step 110, following the formation of the base band module. In an embodiment, the rf module can be provided on a third CMOS IC device region overlying one or more third regions of the first surface region. The third CMOS IC device region can have a third CMOS surface region. In a specific embodiment, the control module, base band module, and rf module can each include one or more CMOS devices. Those of ordinary skill in the art will recognize other variations, modifications, and alternatives.

Once the modules have been formed, a dielectric layer is formed overlying the first, second, and third CMOS surface regions, step 112. In a specific embodiment, the dielectric layer can have one or more patterned regions. A second semiconductor substrate is then joined overlying the dielectric layer, step 114. In an embodiment, the second semiconductor substrate having a second surface region can be joined to the first, second, and third CMOS surface region. In a specific embodiment, this joining step can be accomplished by bonding the second surface region to the dielectric layer. In a specific embodiment, the second semiconductor substrate is an SOI substrate comprising a bulk portion, overlying insulating layer, and a single crystal device layer. In a specific embodiment, the CMOS device layer can be formed using a standing CMOS process from a semiconductor foundry. Of course, there can be other variations, modifications, and alternatives.

Once joined, the second substrate is thinned to a desired thickness while maintaining attachment to the dielectric layer, step 116. In a specific embodiment, the thinning step can include a grinding process to remove a thickness of material from the semiconductor substrate to expose a ground surface region. Additionally, the thinning step can include subjecting the ground surface region to a polishing process to smooth the ground surface region to a predetermined surface roughness. Also, the thinning step can include monitoring a thickness of the second substrate during either or both the grinding process and/or the polishing process. In a specific embodiment, the monitoring includes using an interferometer process to measure an indication associated with the thickness of the second substrate. The interferometer process can use an electromagnetic radiation in an infrared wavelength range. Also, the thinning process can include selectively removing the bulk portion of the SOI substrate from the single crystal device layer while maintaining attachment to the dielectric layer. In a specific embodiment, the thinning process includes cleaving a portion of the second semiconductor substrate at a cleave region to remove the desired thickness from the second substrate. The cleave region can be within a vicinity of the desired thickness, the desired thickness being a remaining portion of the second substrate attached to the dielectric layer. There can be other variations, modifications, and alternatives as well.

Following the thinning process, one or more via structures are formed within one or more portions of the desired thickness of the second substrate, step 118. In a specific embodiment, the one or more via structures can be formed within one or more portions of the second semiconductor substrate, the one or more via structures extending from the second surface region to a vicinity of the desired thickness of the second substrate. The one or more via structures can also be configured as one or more stop structures to form one or more end point regions for the thinning. Afterwards, a conformal coating of metal material is formed within the one or more via structures, step 120. Those skilled in the art will recognize other variations, modifications, and alternatives.

Furthermore, one or more free standing MEMS structures are then formed within one or more potions of the desired thickness of the second substrate. In an embodiment, the one or more MEMS structures can be configured to be supported by one or more members integrally formed on the desired thickness of the second semiconductor substrate. Also, the one or more MEMS structures can be integrally coupled to at least the rf module. In a specific embodiment, the one or more MEMS devices can include a switch, a varactor, an inductor, and a filter. The one or more MEMS devices can include a MEMS varactor coupled to a MEMS switch, the MEMS switch being coupled to one or more MEMS filters. A MEMS clock can also be operably coupled to the control module. In a specific embodiment, the one or more MEMS devices can be formed overlying the first, second, and third CMOS surface regions. The one or more MEMS devices can also include a MEMS varactor configured for an rf frequency. In a specific embodiment, the one or more MEMS devices includes a bank of MEMS filters, the bank of MEMS filters being configured to transmit one or more signals in a GSM, PCS, and DCS formats. Of course, there can be other variations, modifications, and alternatives.

In an embodiment, a sacrificial layer can be formed overlying the one or more free standing MEMS structures. An enclosure layer can also be formed overlying the sacrificial layer, the enclosure layer having one or more openings to expose one or more portions of the sacrificial layer. In a specific embodiment, the enclosure layer can include a titanium material, the titanium material being activated as a getter layer. In further embodiments, the enclosure layer can be selected from a metal, a semiconductor material, an amorphous silicon material, a dielectric layer, or any combination of these materials. Of course, there can be variations, modifications, and alternatives.

In a specific embodiment, the method 100 can also include removing the sacrificial layer via an ashing process to form an open region between one or more free standing MEMS structures and the enclosure layer. This step can also include forming an encapsulating layer overlying the enclosure layer to substantially seal the one or more free standing MEMS structures to form a predetermined environment within the open region. In a specific embodiment, the predetermined environment includes an inert gas at a determined pressure. In a specific embodiment, the encapsulating layer is selected from a metal layer, a spin on glass, a spray on glass, amorphous silicon, a dielectric layer, or any combination of these materials. Furthermore, the method 100 can include forming one or more bond pad openings to expose one or more bond pads coupled to the CMOS device layer. Those of ordinary skill in the art will recognize other variations, modifications, and alternatives.

In further embodiments, the integrated rf MEMS and control systems device can be coupled to one or more power supplies. The integrated rf MEMS and control systems device can also be provided in a cellular phone apparatus. Of course, there can be other variations, modifications, and alternatives.

The above sequence of processes provides a fabrication method for forming an integrated rf MEMS and control systems device according to an embodiment of the present invention. As shown, the method uses a combination of steps including providing a substrate, forming CMOS modules, forming a thickness of a dielectric, joining a substrate overlying the circuits, thinning the substrate, and forming one or more free standing MEMS structures. Other alternatives can also be provided where steps are added, one or more steps are removed, or one or more steps are provided in a different sequence without departing from the scope of the claims herein. Further details of the present method can be found throughout the present specification and more particularly below.

Figure 2:
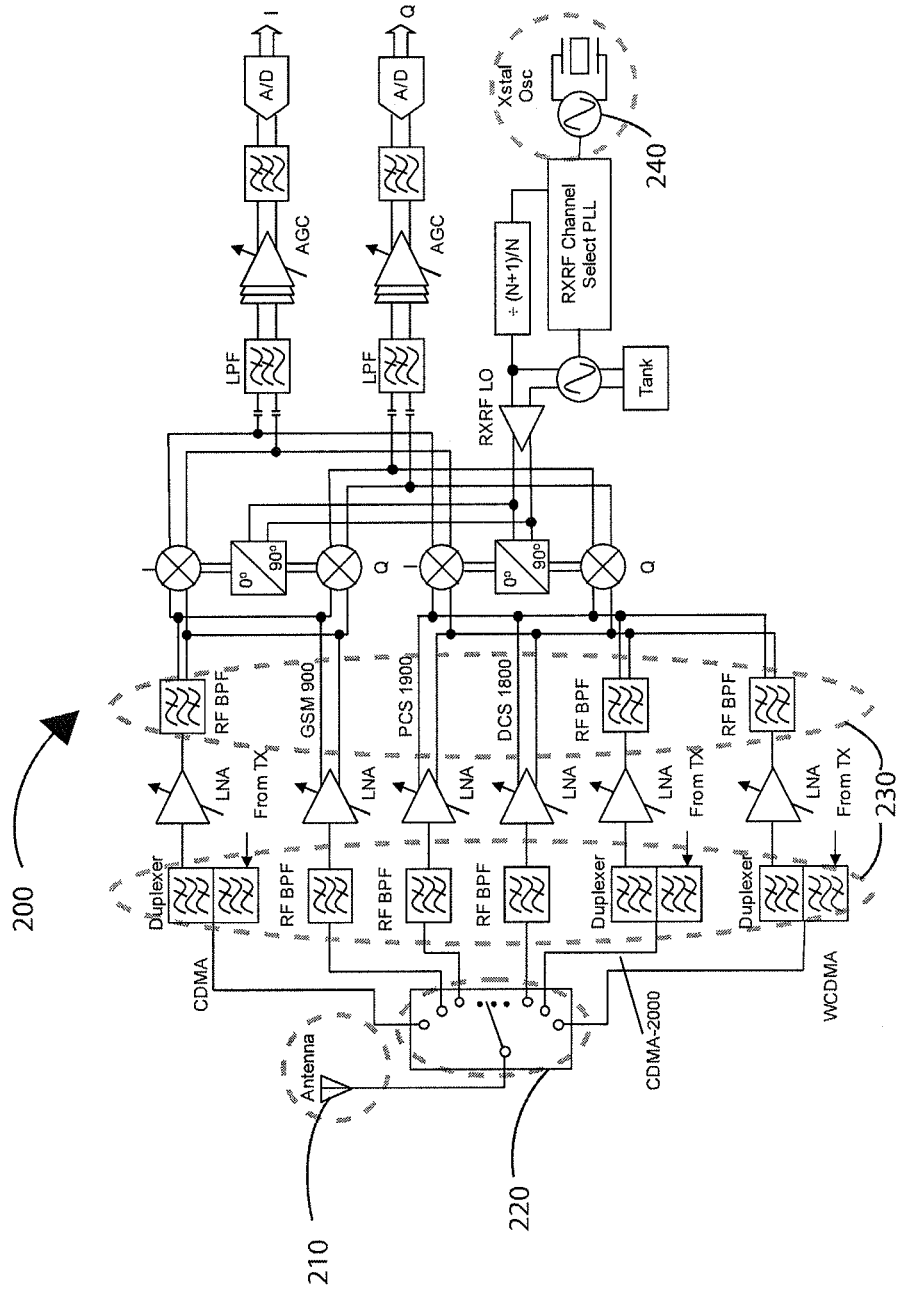
FIG. 2 is a simplified system diagram of an integrated rf MEMS system according to an embodiment of the present invention.

FIG. 2 is a simplified diagram of an rf MEMS system according to an embodiment of the present invention. This diagram is merely an example, which should not unduly limit the scope of the claims herein. One of ordinary skill in the art would recognize other variations, modifications, and alternatives. As shown, system 200 includes CMOS devices and MEMS devices 210-240. In an embodiment, the CMOS devices and MEMS devices can be operably coupled and configured on a common substrate. In a specific embodiment, MEMS devices 210-240 can include a varactor 210, a switch 220, one or more filters 230, and a resonator 240. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
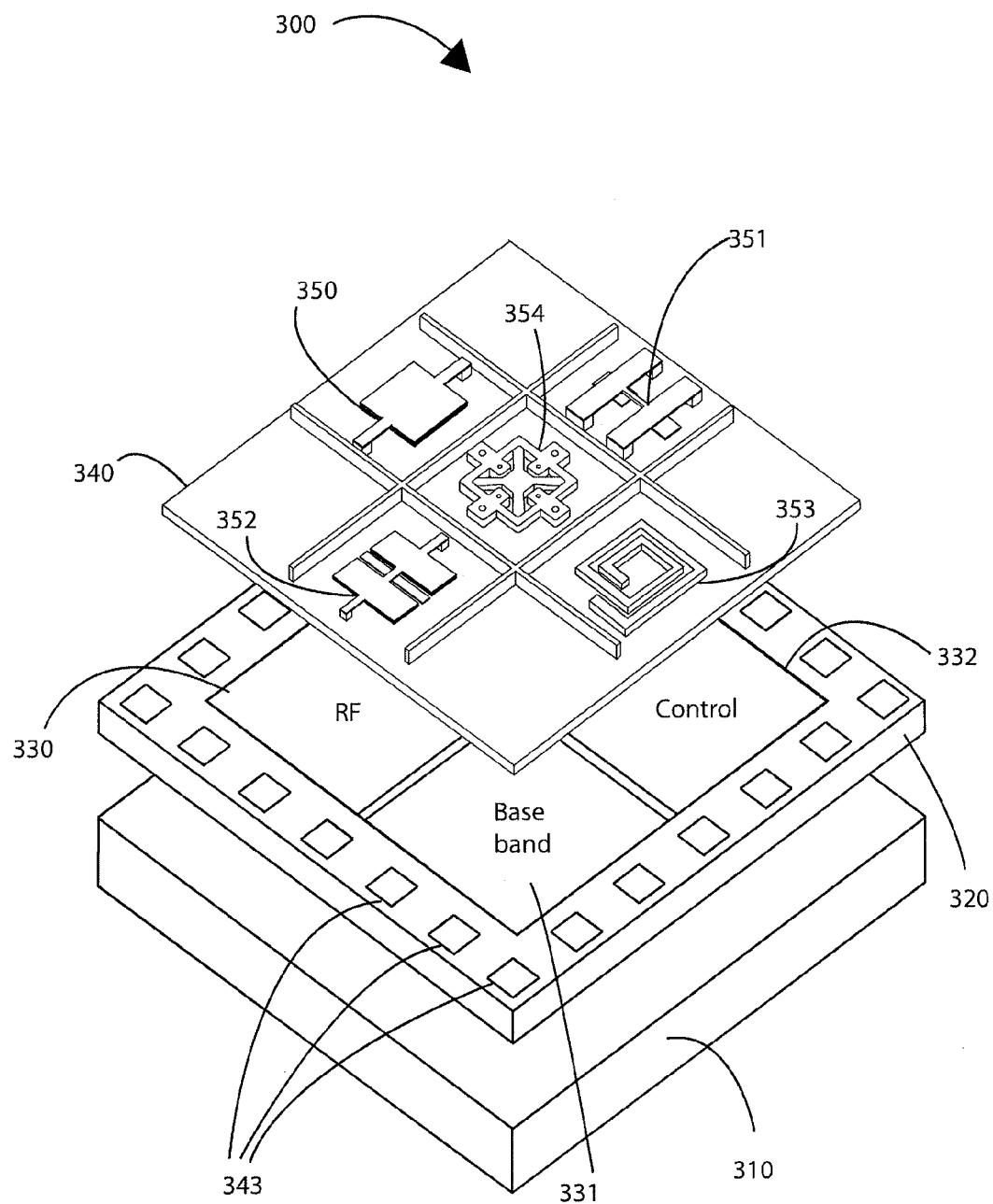
FIG. 3 is a simplified exploded perspective view diagram of an integrated rf MEMS and CMOS devices system according to an embodiment of the present invention.

FIG. 3 is a simplified exploded perspective diagram of an rf MEMS system according to an embodiment of the present invention. This diagram is merely an example, which should not unduly limit the scope of the claims herein. One of ordinary skill in the art would recognize other variations, modifications, and alternatives. As shown, system 300 is an rf MEMS system. System 300 includes a semiconductor substrate 310, (e.g. silicon) a CMOS layer 320, and one or more MEMS devices 350-354. Those of ordinary skill in the art will recognize other variations, modifications, and alternatives.

In an embodiment, system 300 also has a control module 332 provided overlying one or more first regions of the semiconductor substrate according to a specific embodiment. System 300 also has a base band module 331 provided overlying one or more second regions of the semiconductor substrate and an rf module 330 provided overlying one or more third regions of the semiconductor substrate. System 300 also has one or more MEMS devices 350-354 integrally coupled to at least rf module 330. In other embodiments, MEMS devices 350-354 can be integrally coupled to at least broadband module 331, control module 332, or further defined regions of CMOS layer 320. In an embodiment, the CMOS layer 320 can include one or more bond pads 343 and can form an interface region 340. Of course, there can be other variations, modifications, and alternatives.

In a specific embodiment, MEMS devices 350-354 can include a varactor 350, a filter 351, a switch 352, an inductor 353, and a clock 354. These devices 350-354 can be formed overlying the one or more first regions of CMOS layer 320, the one or more second regions of CMOS layer 320, and the one or more third regions of CMOS layer 320. These devices 350-354 can be operably coupled to CMOS layer 320 through interface region 340. Additionally, MEMS clock 354 can be operably coupled to the control module 332, which can include one or more CMOS devices. In other embodiments, MEMS clock 354 can be operably coupled to broadband module 331, rf module 330, other MEMS devices 350-353, or further defined regions of CMOS layer 320. In a specific embodiment, MEMS varactor 350 can be configured for an rf frequency, but can be configured for other frequencies as well. Also, MEMS devices 350-354 can include a bank of MEMS filters 351, which can be configured to transmit one or more signals in formats including but not limited to GSM, PCS, and DCS. Those skilled in the art will recognize other variations, modifications, and alternatives.

In a specific embodiment, system 300 can be coupled to one or more power supplies. Furthermore, system 300 can be provided in a cellular phone apparatus or any other wireless communication device. As said before, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
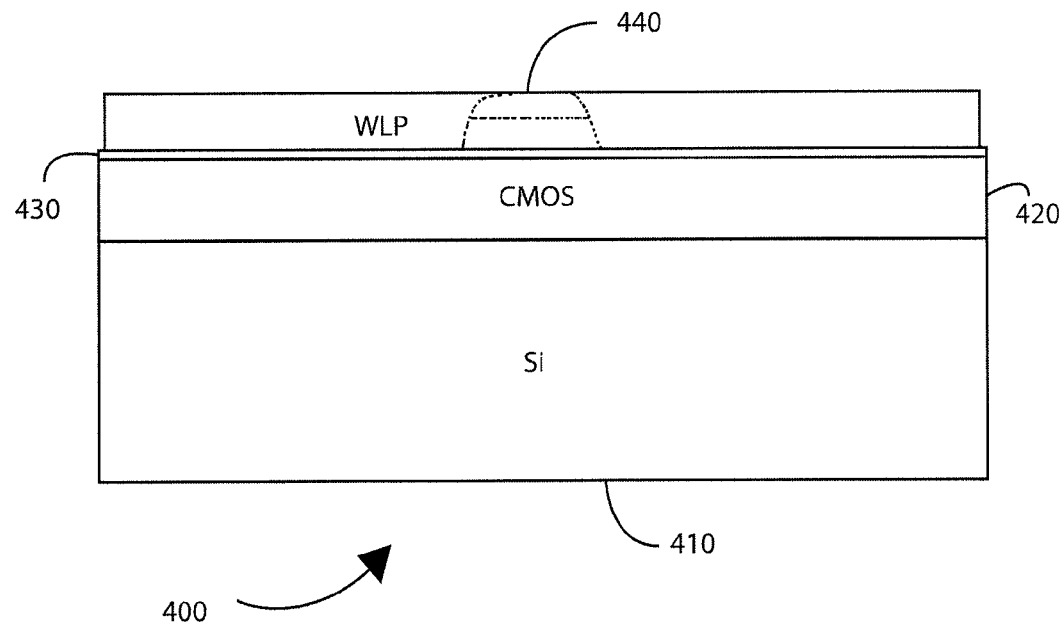
FIG. 4 is a simplified side view diagram of an integrated CMOS-MEMS system according to an embodiment of the present invention.

FIG. 4 is a simplified side view diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 400 includes a substrate layer 410, a semiconductor layer 420, and an encapsulation layer 440. The semiconductor layer 420 covers the substrate layer 410 while also creating a surface region that forms an interface region 430. In an embodiment, the common semiconductor layer 420 can be made of a silicon material or any other appropriate semiconductor. The semiconductor layer 420 can include a CMOS layer or any other appropriate layer for implementing microelectronics.

In another embodiment, the semiconductor layer 420 can include a CMOS layer comprised of any number of metal layers and can be provided on any type of design rule, such as a 0.18 micron design rule or less. Also, the interface region 430 formed by the semiconductor layer can be integrated with any number of MEMS devices and CMOS devices; the CMOS devices can be configured from a foundry compatible process. The CMOS and MEMS devices can all be configured individually in separate portions of the interface region 430. One skilled in the art would recognize other variations, modifications, and alternatives.

In yet another embodiment, the overlying encapsulation layer 440 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 440 can be configured to hermetically seal any number of the integrated devices on the interface region 430. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
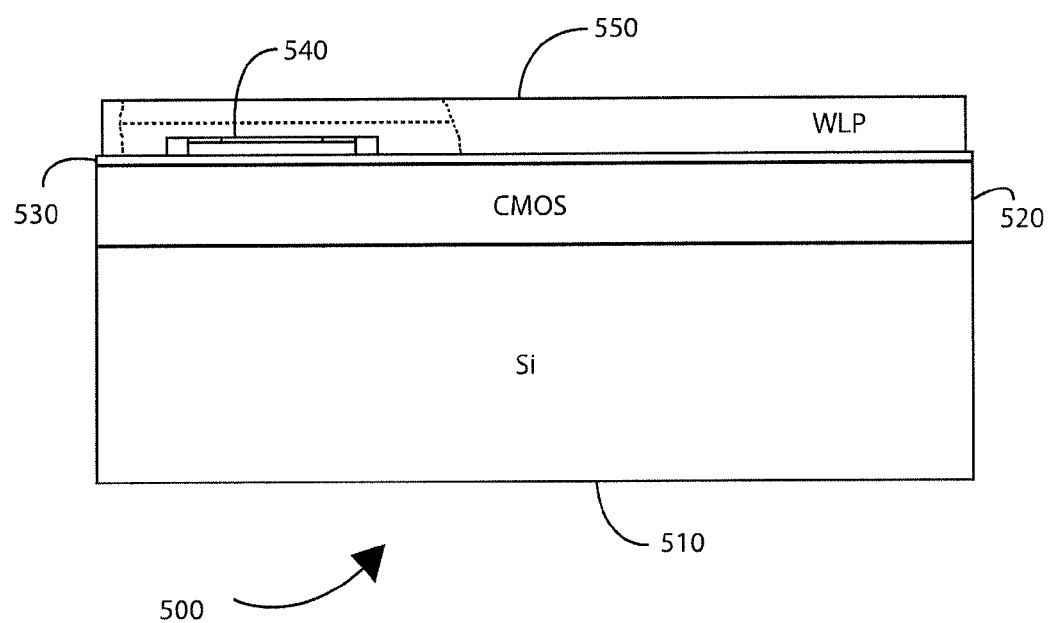
FIG. 5 is a simplified side view diagram of an integrated CMOS-MEMS system according to another embodiment of the present invention.

FIG. 5 is a simplified side view diagram of an integrated CMOS-MEMS system according to another embodiment of the present invention. This diagram is merely an example, which should not unduly limit the scope of the claims herein. One of ordinary skill in the art would recognize other variations, modifications, and alternatives. As shown, the system 500 includes a substrate layer 510, a semiconductor layer 520, an integrated device 540, and an encapsulation layer 550. The semiconductor layer 520 covers the substrate layer 510 while also creating a surface region that forms an interface region 530. In an embodiment, the common semiconductor layer 520 can be made of a silicon material or any other appropriate semiconductor. The semiconductor layer 520 can include a CMOS layer or any other appropriate layer for implementing microelectronics.

In another embodiment, the semiconductor layer 520 can include a CMOS layer comprised of any number of metal layers and can be provided on any type of design rule, such as a 0.18 micron design rule or less. Also, the interface region 530 formed by the semiconductor layer can be integrated with any number of MEMS devices and CMOS devices; the CMOS devices can be configured from a foundry compatible process. The CMOS and MEMS devices can all be configured individually in separate portions of the interface region 530. One skilled in the art would recognize other variations, modifications, and alternatives.

In a specific embodiment, the integrated device 540 can be an accelerometer. In further embodiments, any number of MEMS devices can be included in the integrated system 500, and each of these devices can comprise one or more deposited materials, one or more bonded materials, or others. Of course, there can be other variations, modifications, and alternatives.

In yet another embodiment, the overlying encapsulation layer 540 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 540 can be configured to hermetically seal any number of the integrated devices on the interface region 530. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
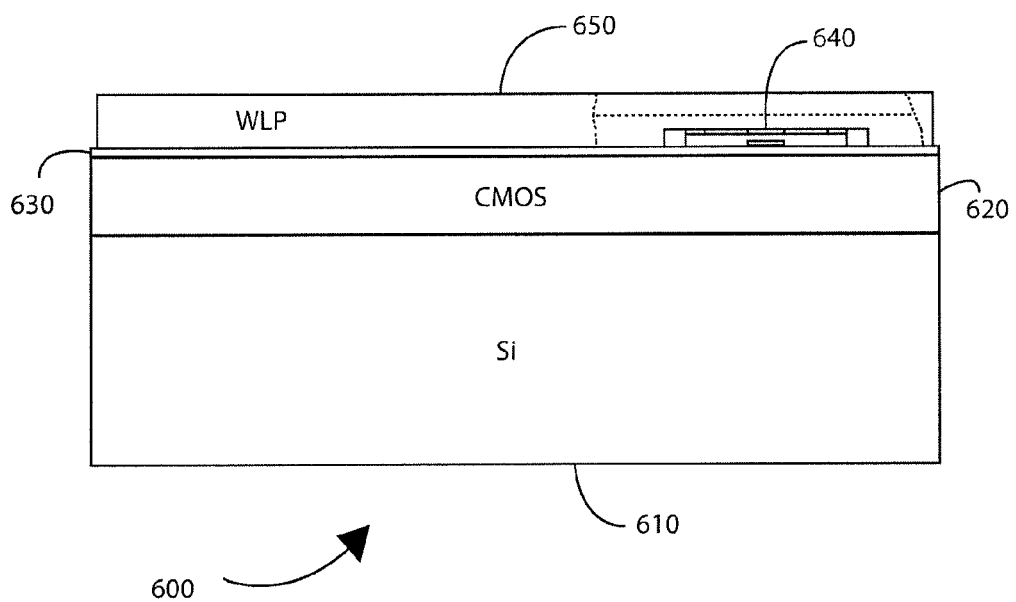
FIG. 6 is a simplified side view diagram of an integrated CMOS-MEMS system according to yet another embodiment of the present invention.

FIG. 6 is a simplified side view diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 600 includes a substrate layer 610, a semiconductor layer 620, an integrated device 640, and an encapsulation layer 650. The semiconductor layer 620 covers the substrate layer 610 while also creating a surface region that forms an interface region 630. In an embodiment, the common semiconductor layer 620 can be made of a silicon material or any other appropriate semiconductor. The semiconductor layer 620 can include a CMOS layer or any other appropriate layer for implementing microelectronics.

In another embodiment, the semiconductor layer 620 can include a CMOS layer comprised of any number of metal layers and can be provided on any type of design rule, such as a 0.18 micron design rule or less. Also, the interface region 630 formed by the semiconductor layer can be integrated with any number of MEMS devices and CMOS devices; the CMOS devices can be configured from a foundry compatible process. The CMOS and MEMS devices can all be configured individually in separate portions of the interface region 630. One skilled in the art would recognize other variations, modifications, and alternatives.

In a specific embodiment, the integrated device 640 can be a gyroscope. In further embodiments, any number of MEMS devices can be included in the integrated system 600, and each of these devices can comprise one or more deposited materials, one or more bonded materials, or others. Of course, there can be other variations, modifications, and alternatives.

In yet another embodiment, the overlying encapsulation layer 640 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 640 can be configured to hermetically seal any number of the integrated devices on the interface region 630. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
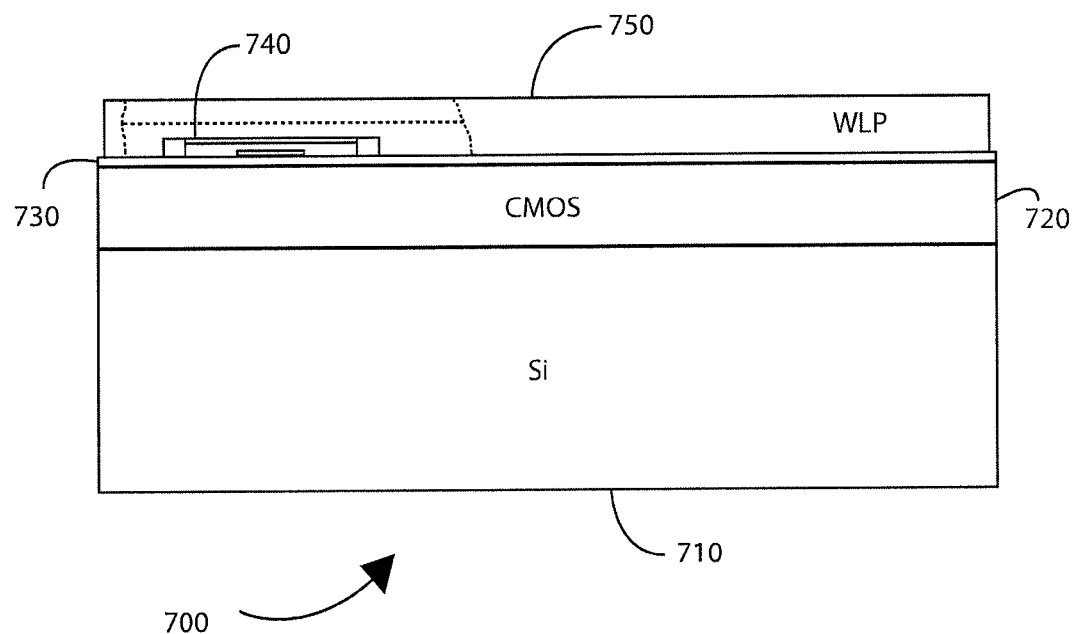
FIG. 7 is a simplified side view diagram of an integrated CMOS-MEMS system according to yet another embodiment of the present invention.

FIG. 7 is a simplified side view diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 700 includes a substrate layer 710, a semiconductor layer 720, an integrated device 740, and an encapsulation layer 750. The semiconductor layer 720 covers the substrate layer 710 while also creating a surface region that forms an interface region 730. In an embodiment, the common semiconductor layer 720 can be made of a silicon material or any other appropriate semiconductor. The semiconductor layer 720 can include a CMOS layer or any other appropriate layer for implementing microelectronics.

In another embodiment, the semiconductor layer 720 can include a CMOS layer comprised of any number of metal layers and can be provided on any type of design rule, such as a 0.18 micron design rule or less. Also, the interface region 730 formed by the semiconductor layer can be integrated with any number of MEMS devices and CMOS devices; the CMOS devices can be configured from a foundry compatible process. The CMOS and MEMS devices can all be configured individually in separate portions of the interface region 730. One skilled in the art would recognize other variations, modifications, and alternatives.

In a specific embodiment, the integrated device 740 can be a magnetic sensor. In further embodiments, any number of MEMS devices can be included in the integrated system 700, and each of these devices can comprise one or more deposited materials, one or more bonded materials, or others. Of course, there can be other variations, modifications, and alternatives.

In yet another embodiment, the overlying encapsulation layer 740 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 740 can be configured to hermetically seal any number of the integrated devices on the interface region 730. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
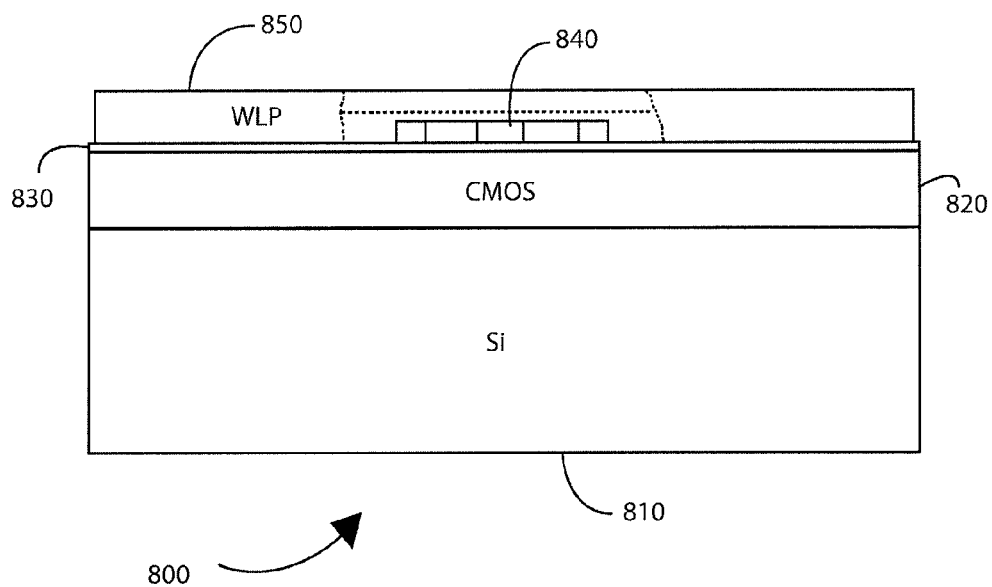
FIG. 8 is a simplified side view diagram of an integrated CMOS-MEMS system according to yet another embodiment of the present invention.

FIG. 8 is a simplified side view diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 800 includes a substrate layer 810, a semiconductor layer 820, an integrated device 840, and an encapsulation layer 850.

The semiconductor layer 820 covers the substrate layer 810 while also creating a surface region that forms an interface region 830. In an embodiment, the common semiconductor layer 820 can be made of a silicon material or any other appropriate semiconductor. The semiconductor layer 820 can include a CMOS layer or any other appropriate layer for implementing microelectronics.

In another embodiment, the semiconductor layer 820 can include a CMOS layer comprised of any number of metal layers and can be provided on any type of design rule, such as a 0.18 micron design rule or less. Also, the interface region 830 formed by the semiconductor layer can be integrated with any number of MEMS devices and CMOS devices; the CMOS devices can be configured from a foundry compatible process. The CMOS and MEMS devices can all be configured individually in separate portions of the interface region 830. One skilled in the art would recognize other variations, modifications, and alternatives.

In a specific embodiment, the integrated device 840 can be a pressure sensor. In further embodiments, any number of MEMS devices can be included in the integrated system 800, and each of these devices can comprise one or more deposited materials, one or more bonded materials, or others. Of course, there can be other variations, modifications, and alternatives.

In yet another embodiment, the overlying encapsulation layer 840 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 840 can be configured to hermetically seal any number of the integrated devices on the interface region 830. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 9:
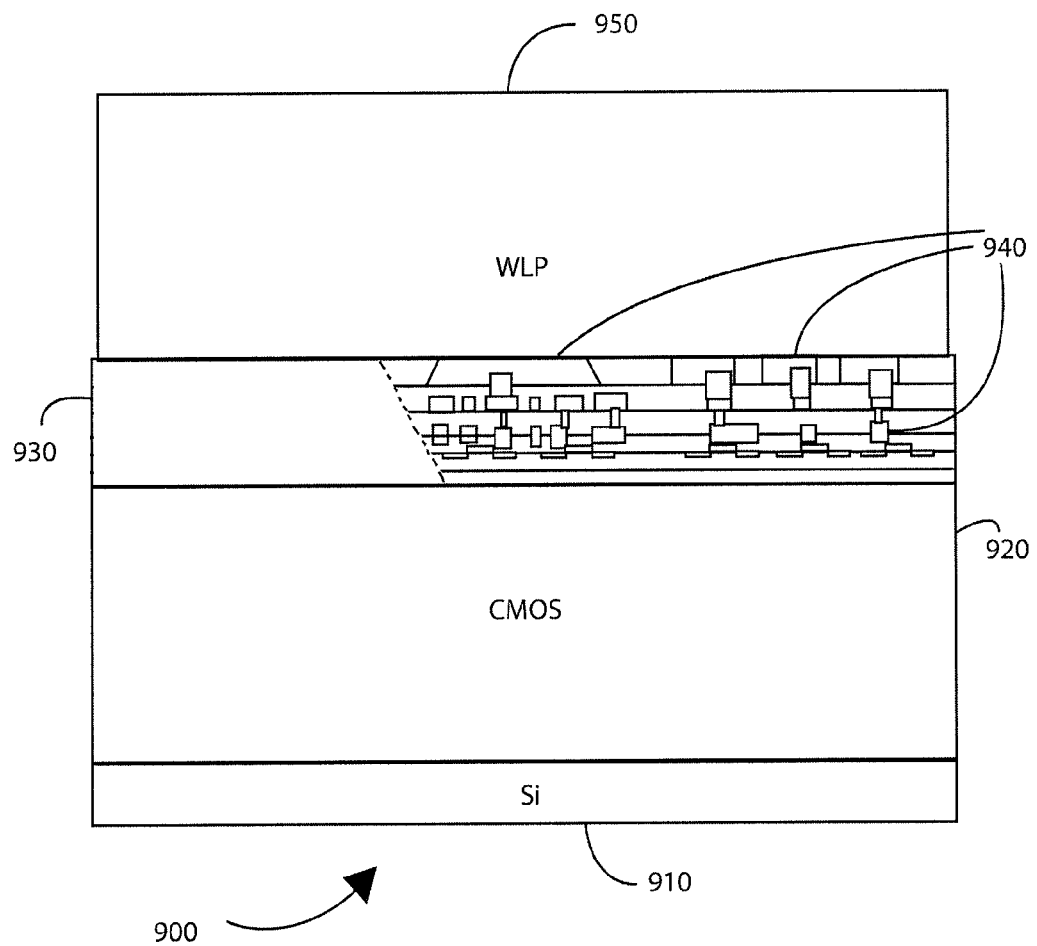
FIG. 9 is a simplified side view diagram of an integrated CMOS-MEMS system according to yet another embodiment of the present invention.

FIG. 9 is a simplified side view diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 900 includes a substrate layer 910, a semiconductor layer 920, a CMOS device 940, and an encapsulation layer 950. The semiconductor layer 920 covers the substrate layer 910 while also creating a surface region that forms an interface region 930. In an embodiment, the common semiconductor layer 920 can be made of a silicon material or any other appropriate semiconductor. The semiconductor layer 920 can include a CMOS layer or any other appropriate layer for implementing microelectronics.

Figure 10:
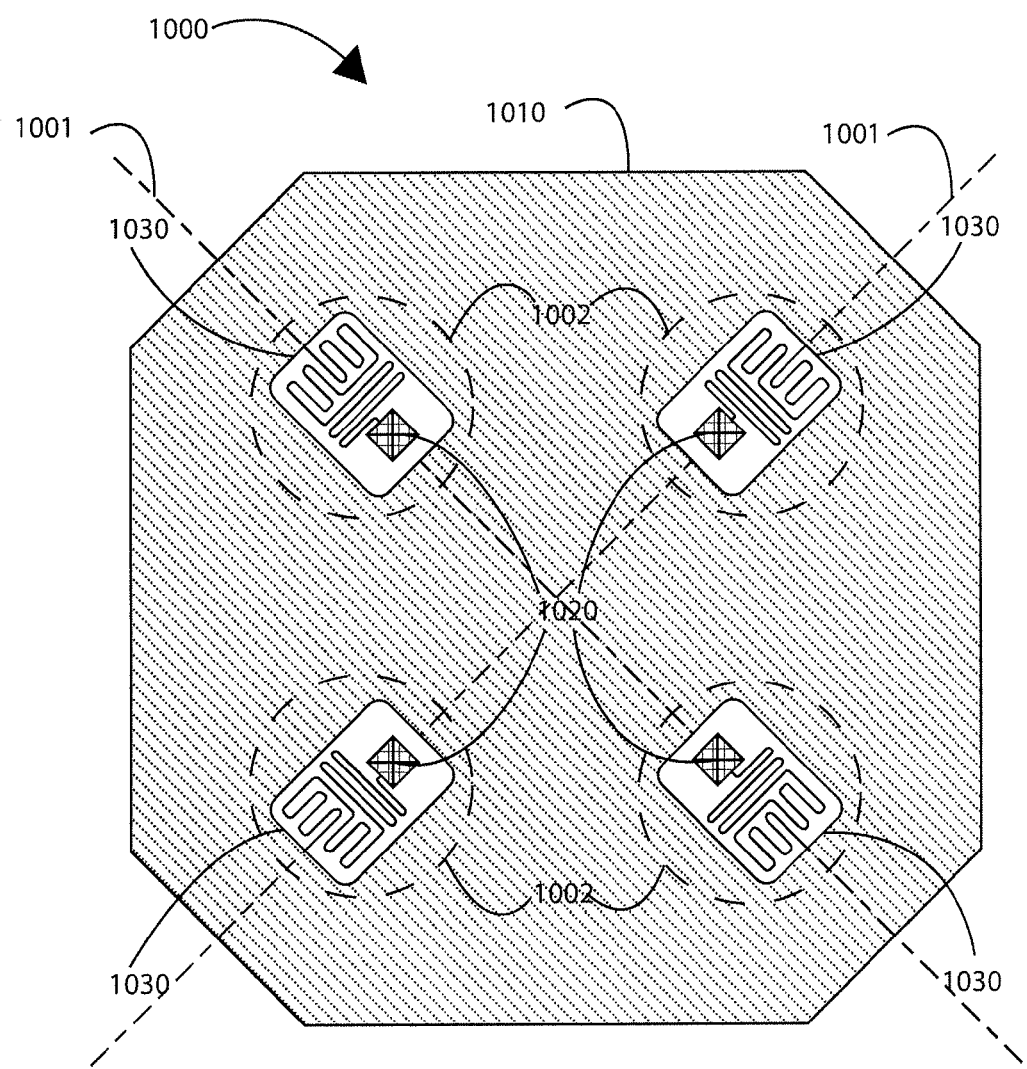
FIG. 10 is a simplified top view diagram of a component of an integrated CMOS-MEMS system according to an embodiment of the present invention.
Figure 11:
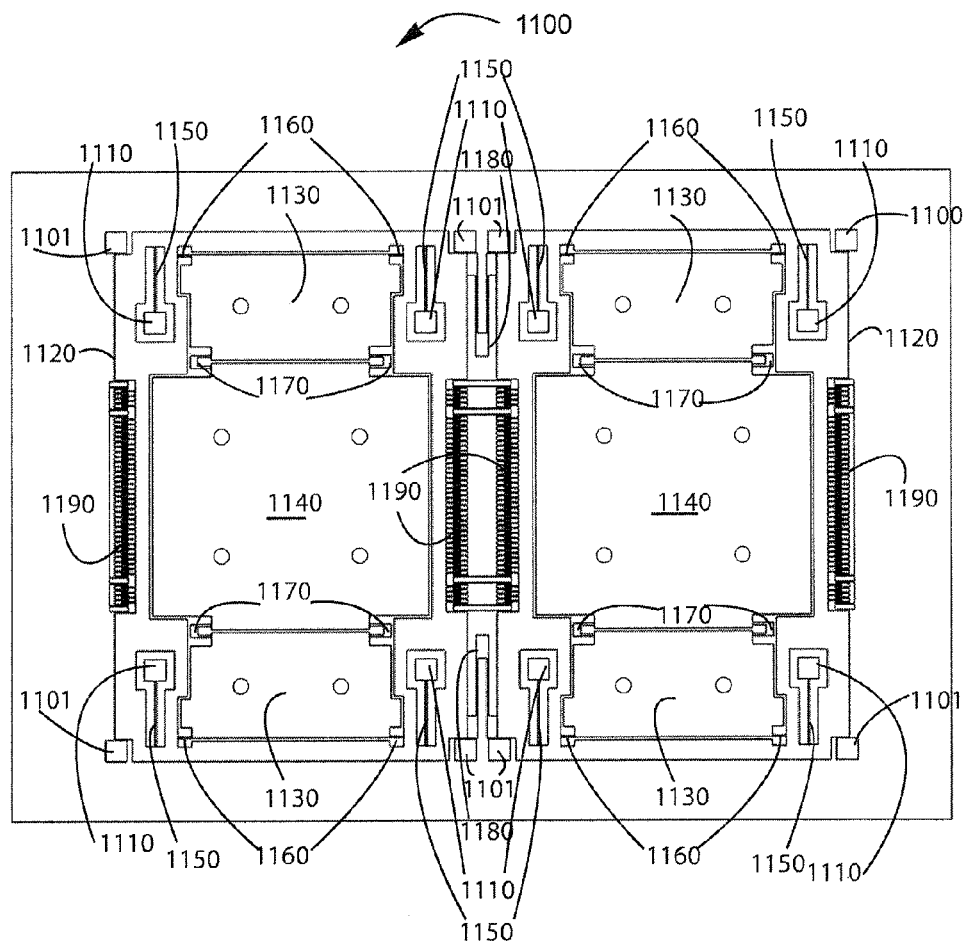
FIG. 11 is a simplified top view diagram of a component of an integrated CMOS-MEMS system according to an embodiment of the present invention.
Figure 12:
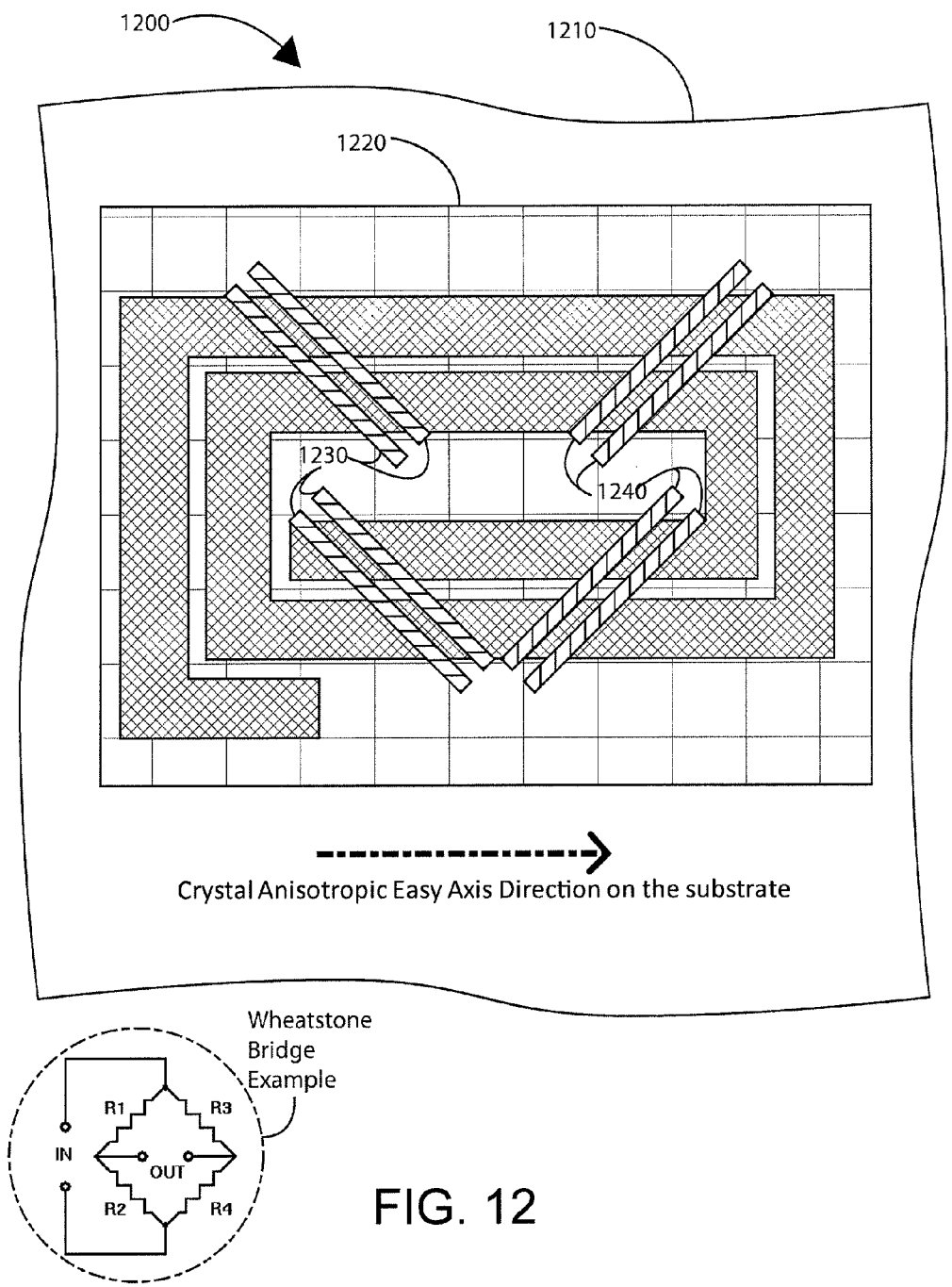
FIG. 12 is a simplified top view diagram of a component of an integrated CMOS-MEMS system according to an embodiment of the present invention.

In another embodiment, the semiconductor layer 920 can include a CMOS layer comprised of any number of metal layers and can be provided on any type of design rule, such as a 0.18 micron design rule or less. The CMOS device 940 can be integrated into the CMOS layer 920 and configured with the interface region 930. Also, the CMOS device 940 can be configured from a foundry compatible process. Also, the interface region 930 formed by the semiconductor layer can be integrated with any number of MEMS devices and CMOS devices; the CMOS devices can be configured from a foundry compatible process. In various embodiments, any number of MEMS devices may be fabricated substantially simultaneously upon interface region 930. For example, MEMS devices may or may not be patterned using the same masks as other MEMS devices, MEMS devices may or may not be fabricated using deposited material that is used for other MEMS devices, MEMS devices may or may not be fabricated using the same process steps that are used to fabricate other MEMS devices, or the like. Using such embodiments, more than one different MEMS device-type can be fabricated upon interface region 930 in parallel, thus saving time compared to serial fabrication of such MEMS devices. FIGS. 10-12 illustrate an example of some of the MEMS devices that can be fabricated approximately in parallel using the techniques described above. The CMOS and MEMS devices can all be configured individually in separate portions of the interface region 930. One skilled in the art would recognize other variations, modifications, and alternatives.

In yet another embodiment, the overlying encapsulation layer 950 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 950 can be configured to hermetically seal any number of the integrated devices on the interface region 930. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

FIG. 10 is a simplified top view diagram of a component of an integrated MEMS-CMOS system according to an embodiment of the present invention. More particularly, the component can be a transducer apparatus, which can be a component of an inertial sensing device, such as an accelerometer. As shown, apparatus 1000 includes a movable base structure 1010, at least one intermediate anchor structure 1020, and at least one intermediate spring structure 1030. In an embodiment, apparatus 1000 can be configured to improve tolerance of external deformations. Those of ordinary skill in the art will recognize other variations, modifications, and alternatives.

In various embodiments, movable base structure 1010 can have an outer surface region, and have at least one portion removed to form at least one inner surface region 1002. In a specific embodiment, movable base structure 1010 can be formed from a single crystal silicon, polycrystalline silicon, or amorphous silicon material. Moveable base structure 1010 can also include a thickness of a polymer or a thickness of a metal material. In other embodiments, movable base structure 1010 can include other materials and combinations thereof. In a specific embodiment, movable base structure 1010 can be a rectangular movable base structure, a patterned polygonal base structure, or the like. Those skilled in the art will recognize other variations, modifications, and alternatives.

In various embodiments, intermediate anchor structure(s) 1020 can be spatially disposed within a vicinity of inner surface region(s) 1002 of the movable base structure. In a specific embodiment, intermediate anchor structure(s) 1020 can be formed from single crystal silicon, polycrystalline silicon, amorphous silicon material, or the like. Intermediate anchor structure(s) 1020 can also include a polymer or metal material, or other materials or combinations thereof. Of course, there can be other variations, modifications, and alternatives.

In an embodiment, intermediate spring structure(s) 1030 can be operably coupled to the intermediate anchor structure(s) 1020 and at least one portion of inner surface region(s) 1002 of movable base structure 1010. In a specific embodiment, intermediate spring structure(s) 1030 can be formed from single crystal silicon, polycrystalline silicon, amorphous silicon material, or the like. Intermediate spring structure(s) 1030 can also include a polymer or metal material, or other materials or combinations thereof. In a specific embodiment, intermediate spring structure(s) 1030 can be spatially oriented to be substantially 45 degrees or substantially (pi/4) radians to the edges of the die. The intermediate spring structure(s) can have at least one segment having a segment length. To determine the orientation of a spring, the segments of the spring, which are connected by folds, are used as a reference. The segments would be positioned such that the segments are perpendicular to diagonal lines 1001. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 1001). Those skilled in the art will recognize other variations, modifications, and alternatives.

In an embodiment, apparatus 1000 can include at least one capacitor element spatially disposed within a vicinity of inner surface region(s) 1002 of movable base structure 1010. The capacitor element(s) can include a fixed capacitor element and a movable capacitor element. The movable capacitor element will generally be disposed in a portion of the movable base structure 1010. In a specific embodiment, the physical basis of apparatus 1000 is to have the average displacement of the fixed capacitor element(s) match the average displacement of the movable capacitor element(s) in response to external deformations. Of course, there can be other variations, modifications, and alternatives.

In an embodiment, apparatus 1000 can be coupled to another MEMS device or an electronic device. In a specific embodiment, apparatus 1000 can be configured to be tolerant of external deformations. Apparatus 1000 can be a transducer apparatus which reduces the area needed for anchors and springs and provides more area for other MEMS components. There can be other variations, modifications, and alternatives as well. Further embodiments of the above device may be found in the co-pending patent application, referred to above.

FIG. 10 is a simplified top view diagram of a component of an integrated MEMS-CMOS system according to various embodiments of the present invention. More particularly, the component can be an inertial sensing device, such as a gyroscope. As shown, device 1100, which can be disposed upon a substrate having a surface region, includes at least one anchor structure 1110, at least one frame structure 1120, at least one movable structure, at least one first flexible member, and at least one second flexible member. In an embodiment, the movable structure(s) can include at least one peripheral movable structure 1130 and at least one central movable structure 1140. The first flexible member(s) can include flexible anchor member(s) 1150 and the second flexible member(s) can include at least one flexible frame member 1160 and/or at least one flexible structure member 1170. Those of ordinary skill in the art will recognize other variations, modifications, and alternatives.

In a specific embodiment, the substrate can include a buried oxide (BOX) substrate. The substrate can include an epitaxial (EPI) material. In further embodiments, the substrate can have a silicon, single crystal silicon, or polycrystalline silicon material. The substrate can also include a dielectric material, a metal material, a metal alloy, or other materials or combination of materials thereof. In a specific embodiment, the substrate can have an integrated circuit layer, such as a CMOS device layer, formed overlying the substrate. Those skilled in the art will recognize other variations, modifications, and alternatives.

In various embodiments, the substrate includes a surface region. At least one anchor structure 1110 can be formed overlying the surface region. At least one flexible anchor member 1150 is coupled to at least a portion of the anchor structure(s). In various embodiments, anchor structure(s) 1110 and flexible anchor member(s) 1150 can include a silicon, dielectric, metal, alloy, or other materials or combination thereof. In a specific embodiment, flexible anchor members 1150 can include torsion spring(s) or bending spring(s). In further embodiments, anchor structure(s) 1110 and flexible anchor member(s) 1150 can be formed together during the same fabrication processes or separately by performing a wet or dry etching or mechanical process. Of course, there can be other variations, modifications, and alternatives.

In an embodiment, frame structure(s) 1120 can be formed having at least a portion coupled to flexible anchor member(s) 1150. Flexible frame member(s) 1160 can be formed and coupled to at least a portion of frame structure(s) 1120. In embodiments wherein more than one frame structure 1120 is formed, at least one flexible coupling member 1180 can be formed to couple frame structure(s) 1120. In various embodiments, frame structure(s) 1120, flexible coupling member(s) 1180 and flexible frame member(s) 1160 can include a silicon, dielectric, metal, alloy, or other materials or combinations thereof. In a specific embodiment, flexible frame member(s) 1160 and flexible coupling member(s) 1180 can include torsion spring(s) or bending spring(s). In further embodiments, frame structure(s) 1120, flexible coupling member(s) 1180, and flexible frame member(s) 1160 can be formed together during the same fabrication processes or separately by performing a wet or dry etching or mechanical process. As stated previously, there can be other variations, modifications, and alternatives.

In various embodiments, peripheral movable structure(s) 1130 can be formed overlying the substrate, having at least one portion coupled to flexible frame member(s) 1160. The movable structure(s), which can be peripheral movable structure(s) 1130, can have at least one flexible tilting member. Flexible structure member(s) 1170 can be formed and coupled to at least a portion of peripheral movable structure(s) 1130. Also, flexible structure member(s) 1170 can be coupled to central movable structure(s) 1140, which can be formed overlying the substrate. In various embodiments, peripheral movable structure 1130, central movable structure 1140, flexible structure and tilting member(s) (referring to flexible structure member(s) 1170) can include a silicon, dielectric, metal, alloy, or other materials or combinations thereof. In a specific embodiment, the flexible structure and tilting member(s) (referring to flexible structure member(s) 1170) can include torsion spring(s) or bending spring(s). Other torsion springs or bending springs can also be formed within at least one portion of central movable structure(s) 1140, such as the underside of central movable structure(s) 1140 which overlies the substrate.

The movable structures can be formed within frame structure(s) 1120. In the example illustrated in FIG. 11, four peripheral movable structures 1130 and two central movable structures 1140 are shown formed within two frame structures 1120. Each frame structures 1120 are coupled to two peripheral movable structures 1130 and one central movable structure 1140. The peripheral and central movable structures 1130/1140 can be proof masses, which can be predetermined test masses used in a measuring device. In further embodiments, the peripheral and central movable structure(s) 1130/1140 and the flexible structure and tilting member(s) [referring to flexible structure member(s) 1170] can be formed together or separately by performing a wet or dry etching or mechanical process. Again, there can be other variations, modifications, and alternatives.

At least one comb structure 1190 can be formed and coupled to at least one portion of frame structure(s) 1120. In various embodiments, comb structure(s) 1190 can be anti-phase driving comb structure(s), which can include a silicon, dielectric, metal, alloy, or other materials or combinations thereof. Additionally, the peripheral and central movable structure(s) 1130/1140 can have stop structures 1101, which can be used to set the boundaries of any vibration, movement, or displacement. A portion of peripheral movable structure 1130 and central movable structure 1140 may be removed. In specific embodiments, peripheral movable structure 1130 and central movable structure 1140 perforations within a line or an array of perforations. In some embodiments, the perforations can be formed by performing an etching process or mechanical process. In various embodiments, all elements mentioned previous can be formed by performing an etching process on one wafer or material. Of course, there can be other variations, modifications, and alternatives. Further embodiments of the above device are disclosed in the co-pending patent application referred to above.

FIG. 12 is a simplified top view diagram of a component of an integrated MEMS-CMOS system according to an embodiment of the present invention. This diagram, which can represent a partially formed three-axis magnetic field sensor device or a two-axis magnetic field sensor device, is merely an example, which should not unduly limit the scope of the claims herein. One of ordinary skill in the art would recognize many other variations, modifications, and alternatives. As shown, device 1200 includes a substrate 1210, an integrated circuit (IC) layer 1220, a first magnetic field sensor element 1230, and a second magnetic field sensor element 1240. Those skilled in the art will recognize other variations, modifications, and alternatives.

In an embodiment, substrate 1210 can have a surface region. In a specific embodiment, substrate 1210 can include a buried oxide (BOX) substrate. Substrate 1210 can include a substrate-on-insulator (SOI) substrate. In another specific embodiment, substrate 1210 can include an epitaxial (EPI) material. In further embodiments, substrate 1210 can have a silicon, single crystal silicon, or polycrystalline silicon material. Substrate 1210 can also include metals, dielectrics, polymers, and other materials and combinations thereof. Those skilled in the art will recognize other variations, modifications, and alternatives.

In an embodiment, IC layer 1220 can be formed overlying at least one portion of the surface region. In a specific embodiment, IC layer 1220 can include an application specific integrated circuit (ASIC) layer, or other type of IC layer or combination thereof. Also, IC layer 1220 can include at least one IC device, CMOS device, or other device. IC layer 1220 can be coupled to the first and second magnetic field sensor elements 1230 and 1240. Those skilled in the art will recognize other variations, modifications, and alternatives.

In an embodiment, first magnetic field sensor element(s) 1230 and second magnetic field sensor element 1240 can be formed overlying at least one portion of the surface region. Magnetic field sensor elements 1230 and 1240 can include ordinary magneto-resistive (OMR) device(s), anisotropic magneto-resistive (AMR) device(s), giant magneto-resistive (GMR) device(s), or tunnel junction magneto-resistive (TMR) device(s). Elements 1230 and 1240 can also be other types of magnetic field sensor devices, sensors, or combinations thereof. In a specific embodiment, magnetic field sensor elements 1230 and 1240 can include thin film devices that can be deposited overlying at least one portion of the surface region. The thin film device(s) can be deposited by a sputtering process or an electric plating process. In a specific embodiment, magnetic field sensor elements 1230 and 1240 are formed as a Wheatstone bridge, a half bridge, or a single element configuration. In an embodiment, magnetic field sensor elements 1230 and 1240 can include at least one layer of dielectric material and/or metal material. As stated previously, there can be other variations, modifications, and alternatives. Further embodiments of the above device are disclosed in the co-pending patent application referred to above.

Figure 13:
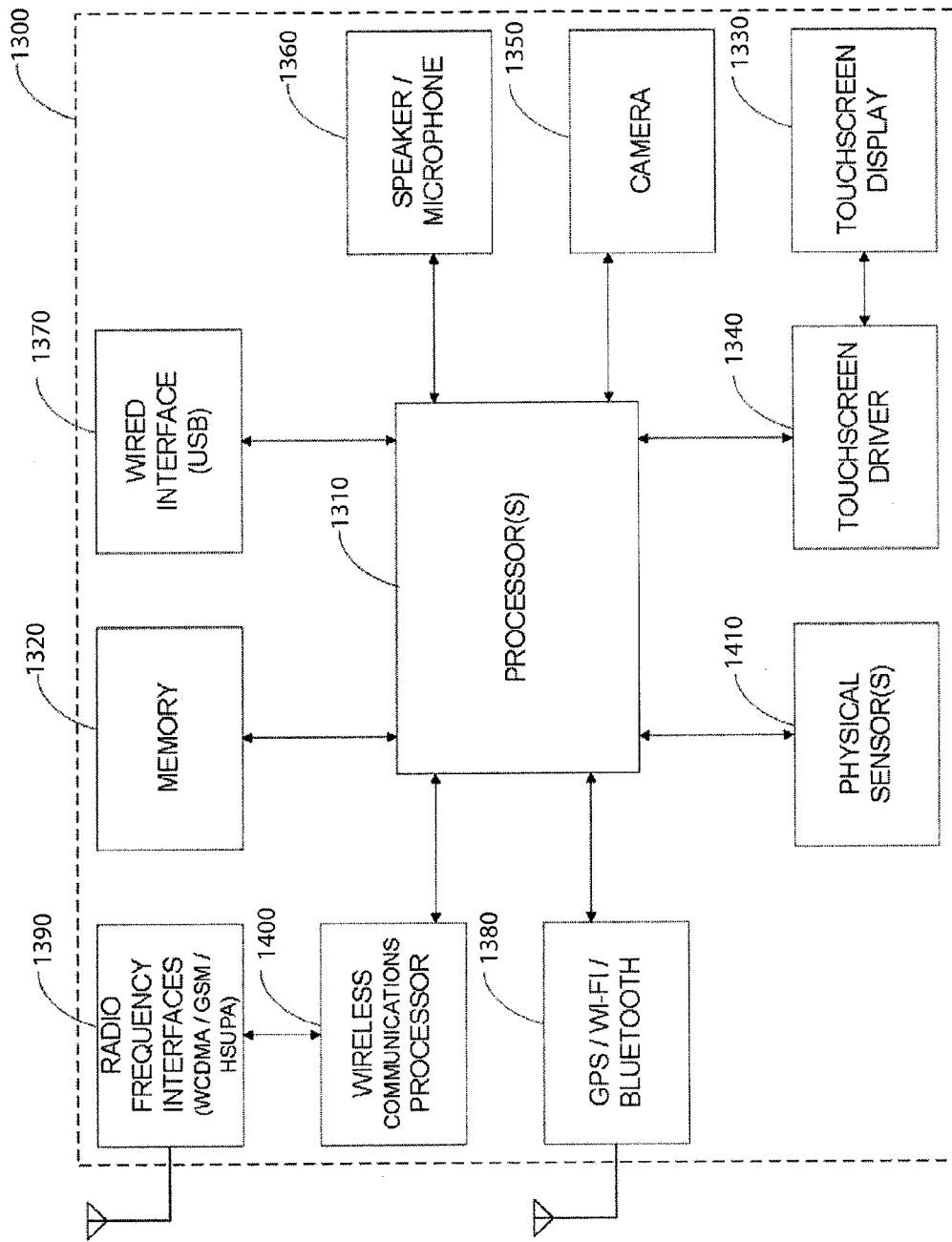
FIG. 13 is a simplified block diagram of a device incorporating various embodiments of the present invention.

FIG. 13 illustrates a functional block diagram of various embodiments of the present invention. In FIG. 13, a computing device 1300 typically includes an applications processor 1310, memory 1320, a touch screen display 1330 and driver 1340, an image acquisition device 1350, audio input/output devices 1360, and the like. Additional communications from and to computing device are typically provided by via a wired interface 1370, a GPS/Wi-Fi/Bluetooth interface 1380, RF interfaces 1390 and driver 1400, and the like. Also included in various embodiments are physical sensors 1410.

In various embodiments, computing device 1300 may be a hand-held computing device (e.g. Apple iPad, Apple iTouch, Dell Mini slate/Streak, Lenovo Skylight/IdeaPad, Samsung Galaxy Tab, Asus EEE series, HP Slate, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1300 may include one or more processors 1310. Such processors 1310 may also be termed application processors, and may include a processor core, a video/graphics core, and other cores. Processors 1310 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR-SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1320 may include different types of memory (including memory controllers), such as flash memory (e.g. NOR, NAND), pseudo SRAM, DDR SDRAM, or the like. Memory 1320 may be fixed within computing device 1300 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1330 and driver 1340 may be based upon a variety of later-developed or current touch screen technology including resistive displays, capacitive displays, optical sensor displays, electromagnetic resonance, or the like. Additionally, touch screen display 1330 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1350 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1360 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1310 to enable the user to operate computing device 1300 by stating voice commands. Additionally, a speech engine may be provided in various embodiments to enable computing device 1300 to provide audio status messages, audio response messages, or the like.

In various embodiments, wired interface 1370 may be used to provide data transfers between computing device 1300 and an external source, such as a computer, a remote server, a storage network, another computing device 1300, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1380 may also be provided to provide wireless data transfers between computing device 1300 and external sources, such as computers, storage networks, headphones, microphones, cameras, or the like. As illustrated in FIG. 13, wireless protocols may include Wi-Fi (e.g. IEEE 802.11a/b/g/n, WiMax), Bluetooth, IR and the like.

GPS receiving capability may also be included in various embodiments of the present invention, however is not required. As illustrated in FIG. 13, GPS functionality is included as part of wireless interface 1380 merely for sake of convenience, although in implementation, such functionality is currently performed by circuitry that is distinct from the Wi-Fi circuitry and distinct from the Bluetooth circuitry.

Additional wireless communications may be provided via RF interfaces 1390 and drivers 1400 in various embodiments. In various embodiments, RF interfaces 1390 may support any future-developed or conventional radio frequency communications protocol, such as CDMA-based protocols (e.g. WCDMA), GSM-based protocols, HSUPA-based protocols, or the like. In the embodiments illustrated, driver 1400 is illustrated as being distinct from applications processor 1310. However, in some embodiments, these functionality are provided upon a single IC package, for example the Marvel PXA330 processor, and the like. It is contemplated that some embodiments of computing device 1300 need not include the RF functionality provided by RF interface 1390 and driver 1400.

FIG. 13 also illustrates computing device 1300 to include physical sensors 1410. In various embodiments of the present invention, physical sensors 1410 can be single axis or multi-axis Micro-Electro-Mechanical Systems (MEMS) based devices being developed by M-cube, the assignee of the present patent application. Physical sensors 1410 can include accelerometers, gyroscopes, pressure sensors, magnetic field sensors, bio sensors, and the like. In various embodiments, physical sensors 1410 may fabricated using the combined CMOS MEMS fabrication techniques described above. More specifically, one or more MEMS devices may be fabricated approximately in parallel using common masks, layers, and processes, above a substrate. In various embodiments, the substrate may be on top of a CMOS device. Both the CMOS and MEMS device may be fabricated using foundry-compatible processes. In other embodiments of the present invention, conventional physical sensors 1410 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1330 and driver 1340 and inputs/or outputs to physical sensors 1410 may be processed in parallel processing threads. In other embodiments, such events or outputs may be processed serially, or the like. Inputs and outputs from other functional blocks may also be processed in parallel or serially, in other embodiments of the present invention, such as image acquisition device 1350 and physical sensors 1410.

FIG. 13 is representative of one computing device 1300 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 13. For example, in various embodiments, computing device 1300 may lack image acquisition unit 1350, or RF interface 1390 and/or driver 1400, or GPS capability, or the like. Additional functions may also be added to various embodiments of computing device 1300, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method for fabricating an integrated rf-MEMS and control systems device, the method comprising:
    providing a first semiconductor substrate having a first surface region;
    forming a control module provided on a first CMOS integrated circuit device region overlying one or more first regions of the first surface region, the first CMOS integrated circuit device region having a first CMOS surface region;
    forming a base band module provided on a second CMOS integrated circuit device region overlying one or more second regions of the first surface region, the second CMOS integrated circuit device region having a second CMOS surface region;
    forming an rf module provided on a third CMOS integrated circuit device region overlying one or more third regions of the first surface region, the third CMOS integrated circuit device region having a third CMOS surface region;
    forming a dielectric layer overlying the first CMOS surface region, the second CMOS surface region, and the third CMOS surface region; and
    forming one or more free standing MEMS structures overlying the dielectric layer and being integrally coupled to at least the rf module;
    wherein forming the one or more freestanding MEMS structures includes forming a transducer apparatus comprising;
    forming a movable base structure having an outer surface region overlying the dielectric layer;
    removing at least one portion from the movable base structure to form at least one inner surface region;
    forming at least one intermediate anchor structure spatially disposed within a vicinity of the inner surface region, the at least one intermediate anchor structure being coupled to the dielectric layer; and
    forming at least one intermediate spring structure coupled to at least one portion of the inner surface region, the intermediate spring structure being coupled to the intermediate anchor structure(s).

2. The method of claim 1 wherein the CMOS device layer is formed using a standing CMOS process from a semiconductor foundry.

3. The method of claim 1 further comprising forming an enclosure layer overlying the one or more freestanding MEMS structures, the enclosure layer having one or more openings to expose one or more portions of the one or more freestanding MEMS structures.

4. The method of claim 3 wherein the enclosure layer comprises a material selected from a group consisting of: a titanium material, the titanium material being activated as a getter layer.

5. The method of claim 3 wherein the enclosure layer is selected from a material selected from a group consisting of: a metal, a semiconductor material, an amorphous silicon material, a dielectric layer, and a combination of these layers.

6. The method of claim 3 further comprising
    forming an encapsulating layer overlying the enclosure layer to substantially seal the one or more free standing MEMS structures to form a predetermined environment within the open region, wherein the predetermined environment comprises an inert gas at a determined pressure.

7. The method of claim 6 wherein the encapsulating layer comprises a material selected from a group consisting of: a metal layer, a spin on glass, a spray on glass, amorphous silicon, a dielectric layer, and any combination of these layers.

8. The method of claim 6 further comprising forming one or more bond pad openings to expose one or more bond pads coupled to the CMOS device layer.

9. The method of claim 1 wherein the one or more freestanding MEMS structures are selected form a group consisting of: a switch, a varactor configured to operate at an rf frequency, an inductor, a filter, a MEMS varactor coupled to a MEMS switch that is coupled of one or more MEMS filters, and a MEMS clock device operably coupled to the control module.

10. The method of claim 1 wherein the one or more freestanding MEMS structures are formed overlying the first CMOS surface region, the second CMOS surface region, and the third CMOS surface region.

11. The method of claim 10
    wherein the control module comprises one or more CMOS devices;
    the base band module comprises one or more CMOS devices; and
    wherein the rf module comprises one or more CMOS devices.

12. The method of claim 1 wherein the one or more freestanding MEMS structures comprises a bank of MEMS filters, the bank of MEMS filters being configured to transmit one or more signals in a GSM format, a PCS format, and a DCS format.

13. The method of claim 1 wherein the integrated rf MEMS and control systems device is provided in a cellular phone apparatus; and wherein the integrated rf MEMS and control systems device is coupled to one or more power supplies.

* * * * *